United States Patent
Yang et al.

(10) Patent No.: US 9,625,820 B2
(45) Date of Patent: Apr. 18, 2017

(54) METHOD OF PATTERNING A THIN FILM

(71) Applicant: NATIONAL TSING HUA UNIVERSITY, Hsinchu (TW)

(72) Inventors: Arnold Chang-Mou Yang, Hsinchu (TW); Wei-Chun Chen, Changhua County (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 25 days.

(21) Appl. No.: 14/732,774

(22) Filed: Jun. 7, 2015

(65) Prior Publication Data
US 2016/0306279 A1    Oct. 20, 2016

(30) Foreign Application Priority Data
Apr. 15, 2015    (TW) ............... 104112098 A

(51) Int. Cl.
*G03F 7/20*    (2006.01)

(52) U.S. Cl.
CPC .............. *G03F 7/2043* (2013.01); *G03F 7/20* (2013.01); *G03F 7/2041* (2013.01)

(58) Field of Classification Search
CPC .................. G03F 7/20; G03F 7/2043
See application file for complete search history.

(56) References Cited

U.S. PATENT DOCUMENTS

| | | | | |
|---|---|---|---|---|
| 2010/0279062 A1* | 11/2010 | Millward | ............ | B81C 1/00031 428/119 |
| 2011/0201201 A1* | 8/2011 | Arnold | ................... | B82Y 30/00 438/694 |
| 2014/0061550 A1* | 3/2014 | Choy | ..................... | C01G 41/02 252/518.1 |

FOREIGN PATENT DOCUMENTS

| | | |
|---|---|---|
| TW | 201008867 A | 3/2010 |
| TW | 201025696 A | 7/2010 |
| TW | 201310739 A | 3/2013 |

* cited by examiner

*Primary Examiner* — Kathleen Duda
(74) *Attorney, Agent, or Firm* — CKC & Partners Co., Ltd.

(57) ABSTRACT

A method of patterning a thin film includes steps as follows. The thin film is formed. The thin film includes a plurality of first molecules, and each of the first molecules has a conjugated structure. A mask is covered on the thin film. The mask includes at least one exposing area, and the exposing area is correspondent to an illuminated region of the thin film. A solvent annealing and illuminating step is conducted, wherein the thin film covered by the mask is illuminated with a light source under an atmosphere of a first solvent, and a wavelength range of the light source is correspondent to an energy enabling the first molecules to reach an excited state. Thus a thickness of the illuminated region of the thin film is increased or decreased so as to form a pattern on the thin film.

16 Claims, 16 Drawing Sheets

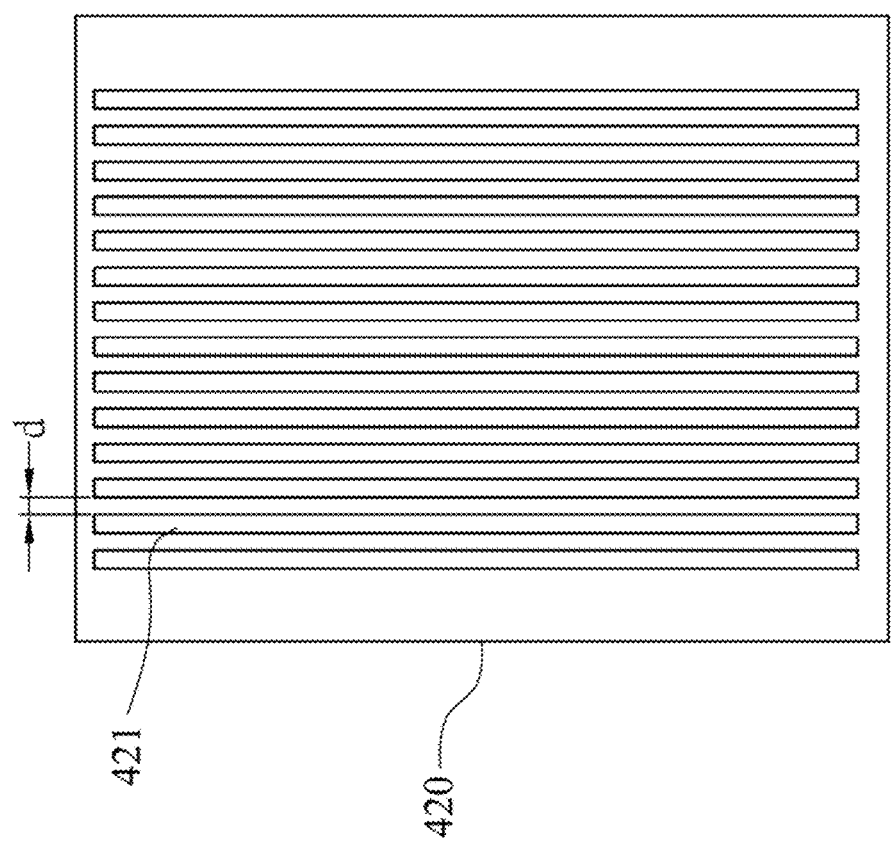

US 9,625,820 B2

METHOD OF PATTERNING A THIN FILM

RELATED APPLICATIONS

This application claims priority to Taiwan Application Serial Number 104112098, filed Apr. 15, 2015, which is herein incorporated by reference.

BACKGROUND

Technical Field

The present disclosure relates to a method of patterning a thin film. More particularly, the disclosure relates to a method of patterning a thin film by controlling a movement direction of a molecule via masking and illuminating.

Description of Related Art

Patterns are conventionally formed by a photoresist etching method, which includes steps of forming a photoresist layer, masking and illuminating the photoresist layer, and developing and etching the photoresist layer. However, the steps of the photoresist etching method are numerous. Furthermore, an etching solution is required, which tends to pollute the environment.

Other conventional methods for patterning a thin film are developed, including a reactive ion etching (RIE) method and a nanoimprint lithography (NIL) method. However, the aforementioned methods have drawbacks of complicated steps, high cost, requiring extremely clean operating environment and high technical difficulty. Accordingly, the aforementioned methods are not favorable for mass production.

In view of the foregoing, how to develop a new method for forming patterns, which has a simpler process for enhancing the production efficiency and does not require an etching solution to meet the environmental demand, is the goal of the related industry and academics.

SUMMARY

According to one aspect of the present disclosure, a method of patterning a thin film includes steps as follows. The thin film is formed. The thin film includes a plurality of first molecules, and each of the first molecules has a conjugated structure. A mask is covered on the thin film. The mask includes at least one exposing area, and the exposing area is correspondent to an illuminated region of the thin film. A solvent annealing and illuminating step is conducted, wherein the thin film covered by the mask is illuminated with a light source under an atmosphere of a first solvent, and a wavelength range of the light source is correspondent to an energy enabling the first molecules to reach an excited state. Thus, a thickness of the illuminated region of the thin film is increased or decreased so as to form a pattern on the thin film.

BRIEF DESCRIPTION OF THE DRAWINGS

The disclosure can be more fully understood by reading the following detailed description of the embodiment, with reference made to the accompanying drawings as follows.

FIG. 5 is a schematic view showing a mask in FIG. 4;

DETAILED DESCRIPTION

Figure 1:
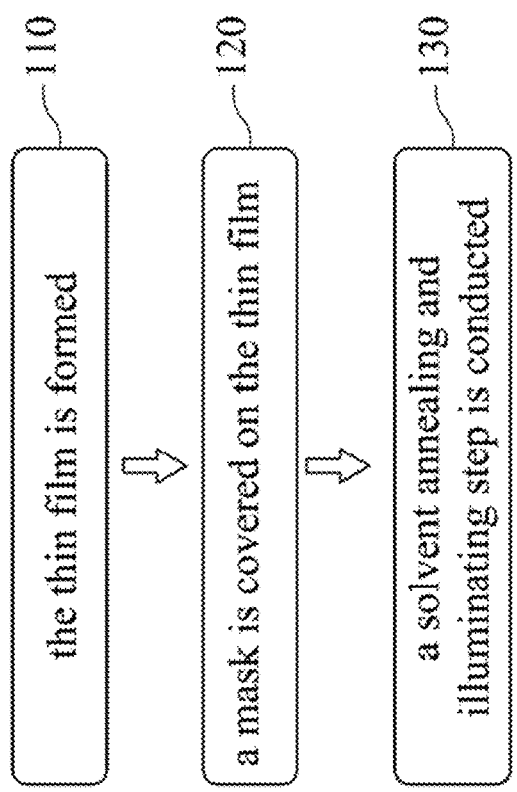
FIG. 1 is a flow diagram showing a method of patterning a thin film according to one embodiment of the present disclosure.

FIG. 1 is a flow diagram showing a method of patterning a thin film according to one embodiment of the present disclosure. In FIG. 1, the method of patterning the thin film includes Step 110, Step 120 and Step 130.

In Step 110, the thin film is formed. The thin film includes a plurality of first molecules, and each of the first molecules has a conjugated structure. The aforementioned term "conjugated structure" is a structure having single bonds and double bonds alternatively arranged, and delocalized π bonds are generated thereby. With the conjugated structure, when the first molecules are illuminated with a light source for providing a proper energy, the first molecules can generate excitons and reach an excited state. The first molecules in the excited state are more planar and rigid than the first molecules in a ground state (i.e., the first molecules are not illuminated with the light source providing the proper energy). The molecular entropy, the molecular free energy, and the molecular movement ability can be controlled, and the molecular flow between an illuminated region and a dark region of the thin film can be further controlled. The first molecules can be but not limited to poly(p-phenylene vinylene), polyaniline, polypyrrole, polythiophene, polyacetylene or a derivative thereof. Each of the first molecules has a plurality of repeated units, and the number of the repeated units can be greater than three. The aforementioned term "derivative" is the poly(p-phenylene vinylene), the polyaniline, the polypyrrole, the polythiophene or the polyacetylene in which at least one hydrogen atom thereof is substituted by another substituent. When at least one hydrogen atom of each of the first molecules is substituted by another substituent, the solubility for different solvent can be improved, the crystallinity of the first molecules can be improved, or the color of the emitting light of the first molecules can be controlled. How to improve the properties of the first molecules by selecting different substituent is well known in the related art, and is not repeated herein. Examples of the derivatives of the first molecules are recited as follows, MEH-PPV is a derivative of the poly(p-phenylene vinylene), and poly(3-hexylthiophene) [the abbreviation is P3HT] is a derivative of the polythiophene. The energy required by different first molecules to reach the excited state is also well known, and is not repeated herein. Furthermore, Step 110 can be achieved by a spin coating method. A thickness of the thin film can be 2 nm to 100 nm, which is beneficial to apply to the field of the nanotechnology and micro components.

Figure 2:
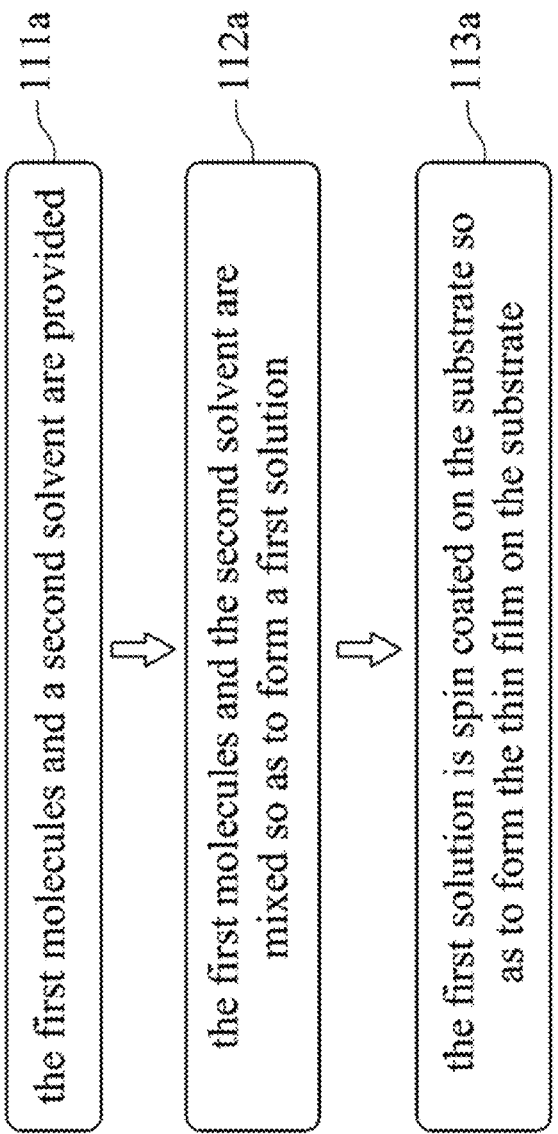
FIG. 2 is a flow diagram showing Step 110 of FIG. 1.

When the thin film only includes the first molecules, the formation of the thin film is as follows. FIG. 2 is a flow diagram showing Step 110 of FIG. 1. In FIG. 2, Step 110 includes Step 111a, Step 112a and Step 113a.

In Step 111a, the first molecules and a second solvent are provided, wherein the kind of the second solvent should go with the kind of the first molecules. Specifically, the second solvent can dissolve the first molecules, which is beneficial to conduct the following spin coating step. The second solvent can be but not limited to toluene, tetrahydrofuran, cyclohexanone or a mixture thereof. According to one example of the present disclosure, the first molecules are poly[2-methoxy-5-((2'-ethylhexyl)oxy)-1,4-phenylenevinylene], (the abbreviation is MEH-PPV), the second solvent is a mixture of toluene, tetrahydrofuran and cyclohexanone in a volume ratio of 1:1:1.

In Step 112a, the first molecules and the second solvent are mixed so as to form a first solution. The purpose of Step 112a is to mix the first molecules and the second solvent uniformly, so that the first solution can transform to a uniform thin film on a substrate in Step 113a. The temperature of Step 112a can range from a room temperature to a boiling point of the second solvent, and the operating time of Step 112a can range from 1 minute to 15 days. According to one example of the present disclosure, Step 112a can be conducted by stirring at 30° C. to 70° C. for 24 hours to 72 hours.

In Step 113a, the first solution is spin coated on the substrate so as to form the thin film on the substrate. The rotational speed and the time required by Step 113a should be capable of obtaining a uniform thin film. For example, Step 113a can be conducted at the rotational speed of 1000 rpm (revolution per minute) to 10000 rpm for 10 seconds to 30 seconds. The substrate can be a silicon wafer, a conductive glass substrate or a glass substrate. According to one example of the present disclosure, the substrate is a silicon wafer. The silicon wafer has a surface smoothness at the atomic level, which is beneficial to apply to manufacture micro components.

The thin film can further include a plurality of second molecules, and the weight ratio of the first molecules and the second molecules can be 1:99 to 99:1. Each of the second molecules can have a conjugated structure or have no conjugated structure. When each of the second molecules has the conjugated structure, an energy enabling the first molecules to reach the excited state is different from an energy enabling the second molecules to reach an excited state, i.e., the first molecules and the second molecules are different. The second molecules having the conjugated structure can be poly(p-phenylene vinylene), polyaniline, polypyrrole, polythiophene, polyacetylene or a derivative thereof. The second molecules having no conjugated structure can be polystyrene (PS), polymethyl methacrylate (PMMA), polycarbonate (PC) or a derivative thereof. Each of the second molecules has a plurality of repeated units, and the number of the repeated units can be greater than three. Base on the facts that the first molecules and the second molecules are different and the first molecules have the conjugated structure, when the first molecules and the second molecules are illuminated with the light source which provides the proper energy enabling the first molecules to generate excitons and reach the excited state. The first molecules in the excited state are more planar and rigid than the first molecules in a ground state (i.e., the first molecules are not illuminated with the light source providing the proper energy). As a result, the molecular entropy of the first molecules reduced, and the free energy of the region of the thin film where the first molecule located increases, so that the molecular flow between the illuminated region and the dark region of the thin film occurs for balancing the distribution of the free energy of the thin film, and the movement direction and velocity of at least one of the first molecules, the second molecules and a first solvent can be controlled. The detail of the first solvent will be described hereinafter.

The aforementioned term "molecular flow" is the movement of the molecules of the thin film and/or the molecules of the first solvent. Specifically, when the thin film only includes the first molecules, the molecular flow is the movement of the first molecules and/or the molecules of the first solvent; when the thin film includes the first molecules and the second molecules, the molecular flow is the movement of the first molecules, and/or the second molecules, and/or the molecules of the first solvent; when the thin film includes at least three kinds of molecules, the molecular flow is in an analogous fashion.

The weight ratio of the first molecules and the second molecules can be 5:95 to 15:85. Therefore, the difference between the mobility of the first molecules and the mobility of the second molecules can be controlled, and the direction and velocity of the molecular flow in the thin film can be further controlled.

Figure 3:
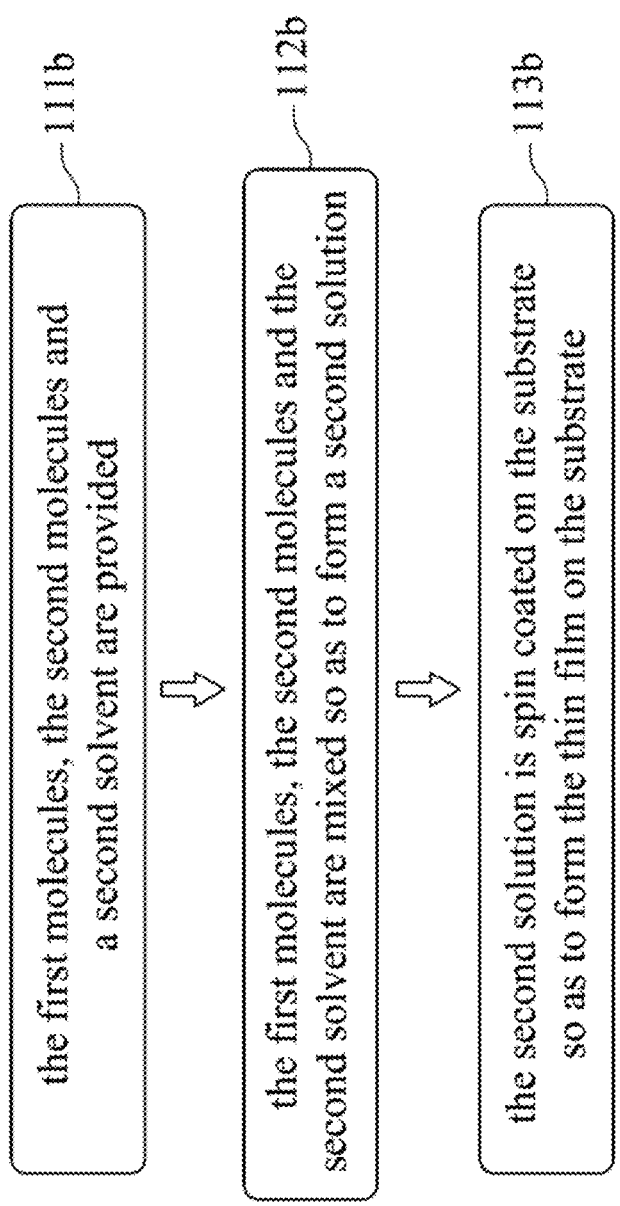
FIG. 3 is another flow diagram showing Step 110 of FIG. 1.

When the thin film includes the first molecules and the second molecules, the formation of the thin film is as follows. FIG. 3 is another flow diagram showing Step 110 of FIG. 1. In FIG. 3, Step 110 includes Step 111b Step 112b and Step 113b.

In Step 111b, the first molecules, the second molecules and a second solvent are provided, wherein the kind of the second solvent should go with the kind of the first molecules and the second molecules. Specifically, the second solvent can dissolve the first molecules and the second molecules, which is beneficial to conduct the following spin coating step. The second solvent can be but not limited to toluene, tetrahydrofuran, cyclohexanone or a mixture thereof. According to one example of the present disclosure, the first molecules are poly[2-methoxy-5-((2'-ethylhexyl)oxy)-1,4-phenylenevinylene], the second molecules are polystyrene the second solvent is a mixture of toluene, tetrahydrofuran and cyclohexanone, and a volume ratio of the toluene, the tetrahydrofuran and the cyclohexanone is 1:1:1.

In Step 112b, the first molecules, the second molecules and the second solvent are mixed so as to form a second solution. The purpose of Step 112a is to mix the first molecules, the second molecules and the second solvent uniformly, so that the second solution can transform to a uniform thin film on a substrate in Step 113b. The temperature of Step 112b can range from a room temperature to a boiling point of the second solvent, and the operating time of Step 112b can range from 1 minute to 15 days. According to one example of the present disclosure, Step 112b can be conducted by stirring at 30° C. to 70° C. for 24 hours to 72 hours.

In Step 113b, the second solution is spin coated on the substrate so as to form the thin film on the substrate. The rotational speed and the time required by Step 113b should be capable of obtaining a uniform thin film. For example, Step 113b can be conducted at the rotational speed of 1000 rpm to 10000 rpm for 10 seconds to 30 second. The substrate can be a silicon wafer, a conductive glass substrate or a glass substrate. According to one example of the present disclosure, the substrate is a silicon wafer. The silicon wafer has a surface smoothness at the atomic level, which is beneficial to apply to manufacture micro components.

Please refer back to FIG. 1. In Step 120, a mask is covered on the thin film. The mask includes at least one exposing area. The exposing area of the mask is for allowing light rays to pass therethrough, and the other area of the mask is for blocking light rays. The exposing area of the mask is correspondent to the illuminated region of the thin film, and the other area of the mask is correspondent to the dark region of the thin film. According to one example of the present disclosure, the mask includes a plurality of exposing areas, a shortest distance between any two of the exposing areas adjacent to each other is greater than 0, and is smaller than or equal to 5 μm. Therefore, the photoluminescence efficiency (such as luminescence intensity) of the thin film can be significantly increased while a pattern is formed on the thin film, which is beneficial to apply to the fields of light-emitting diodes and solar cells. According to one example of the present disclosure, the mask can include a plurality of exposing areas which are parallel to each other. Therefore, a linear pattern can be formed on the thin film.

In Step 130, a solvent annealing and illuminating step is conducted. The thin film covered by the mask is illuminated with the light source under an atmosphere of the first solvent. A wavelength range of the light source is correspondent to the energy enabling the first molecules to reach the excited state, so that the first molecules are in the excited state after illuminating by the light source. The first molecules in the excited state are more planar and rigid than the first molecules in the ground state. As a result, the molecular entropy of the first molecules reduced, and the free energy of the region of the thin film where the first molecule located increases, so that the molecular flow between the illuminated region and the dark region of the thin film occurs for balancing the distribution of the free energy of the thin film, and the movement direction and velocity of at least one of the first molecules, the second molecules and a first solvent can be controlled. Thus, a thickness of the illuminated region of the thin film is increased or decreased so as to form a pattern on the thin film. The first solvent should be capable of infiltrating into the thin film and can cause the plasticization of the first molecules and the second molecules, so that the movement ability of the first molecules and the second molecules can be increased. In other words, the effect provided by the first solvent is substantially the same with the increase of temperature. Furthermore, when the thin film is removed from the atmosphere of the first solvent, the first solvent can escape from the inside of the thin film quickly. The first solvent can be but not limited to toluene, p-xylene, methanol, tetrahydrofuran, cyclohexanone, benzene, dichlorobenzene, dichloromethane, acetone or a mixture thereof. Different degree of the plasticization of the first molecules and the second molecules can be provided by selecting different kinds of the first solvent. According to one example of the present disclosure, the first solvent is toluene.

Figure 4:
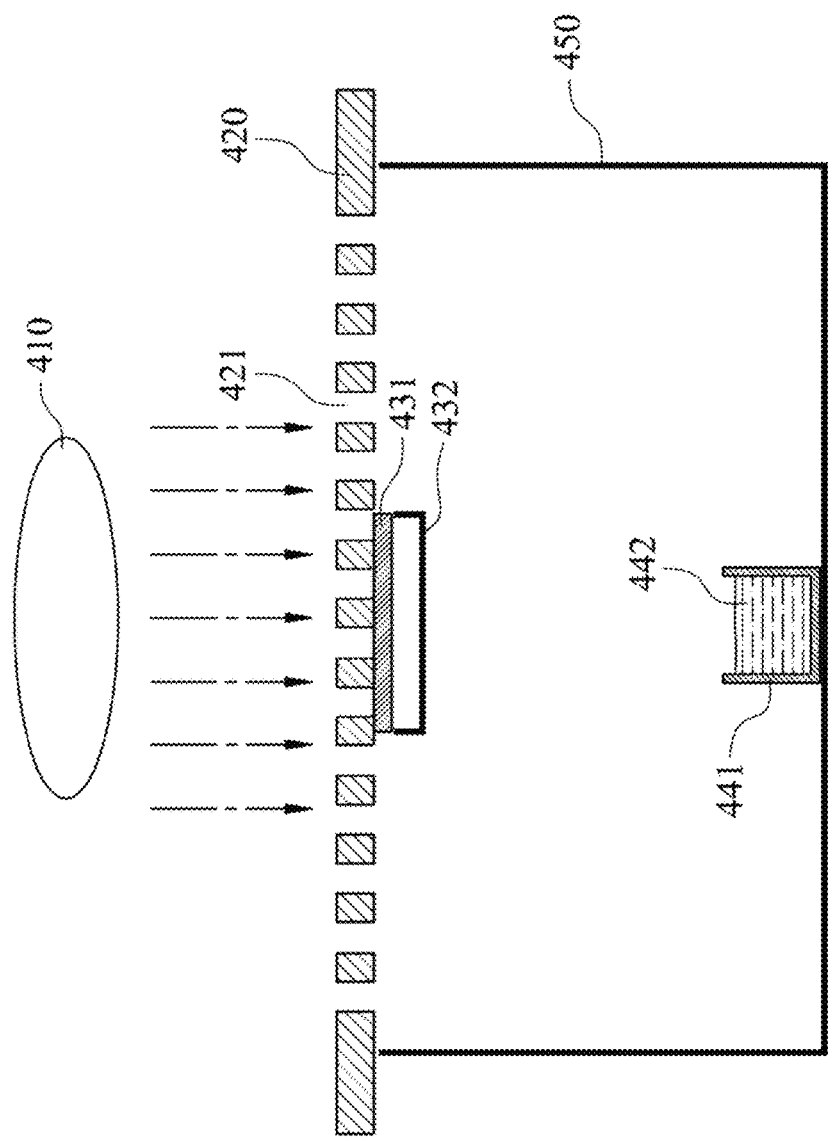
FIG. 4 is a schematic view showing an experimental apparatus used in Step 130 of FIG. 1.

FIG. 4 is a schematic view showing an experimental apparatus used in Step 130 of FIG. 1. In FIG. 4, a is disposed inside a container 450. The first solvent 442 is contained in the container 441. Thus, the solvent annealing and illuminating step can be conducted under the atmosphere of the first solvent 442. The mask 420 is disposed on the upper opening of the container 450. The mask 420 includes a plurality of exposing areas 421 and is covered on the thin film 431. The thin film 431 is formed on the substrate 432. The thin film 431 covered by the mask 420 is illuminated with the light source 410. The wavelength range of the light source is correspondent to the energy enabling the first molecules to reach the excited state. As a result, the first molecules in the illuminated region (its reference numeral is omitted) of the thin film 431 correspondent to the exposing area 421 become rigid, and a thickness of the illuminated region of the thin film 431 increases or decreases so as to form the pattern on the thin film 431.

FIG. 5 is a schematic view showing the mask 420 in FIG. 4. The mask 420 includes the plurality of exposing areas 421 parallel to each other, and a linear pattern can be formed thereby. In other examples, the exposing areas 421 are not limited to be arranged in parallel, and the mask 420 can include only one exposing area 421. In other words, the arrangement and the number of the exposing areas 421 can be adjusted according to practical needs, such as the shape of the pattern. The shortest distance between any two of the exposing areas 421 adjacent to each other is d. According to one example, d is equal to 50 μm. According to another example, d is equal to 5 μm.

Experimental Materials

MEH-PPV (purchased from. Sigma-Aldrich Corporation) having a weight-average molecular weight of 200 k or 55 k, and MEH-PPV has a structure of formula (I). PS (purchased from Pressure Chemical Company) having a weight-average molecular weight of 2 k, and PS has a structure of formula (II).

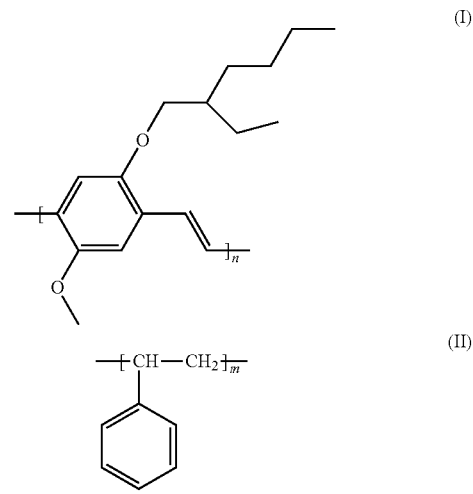

The substrate is a p-type silicon wafer having an orientation of 1-0-0. The p-type silicon wafer doped with boron (B) has a resistivity of 3-30 Ω-cm and a thickness about 550 μm.

EXAMPLES

1st Example

MEH-PPV (200 k) and PS (2 k) in a weight ratio of 10:90 are put into a glass container, and a second solvent is added therein. The second solvent is a mixture of toluene, tetrahydrofuran and cyclohexanone in a volume ratio of 1:1:1. A magnetic stir bar is put into the glass container, and then the glass container is heated with a magnetic stirrer at 50° C. for about 2 days. The solution in the glass container is filtered with a 0.2 µm filter so as to obtain a second solution. The second solution is spin coated on a silicon wafer with a spin coater at a rotational speed of 4000 rpm for 20 seconds. A thin film is formed on the silicon wafer. The silicon wafer with the thin film disposed in a vacuum device is evacuated for one day, so that the second solvent remained in the thin film can be volatilized. A thickness of the thin film of the 1st example is 31 nm which is measured by AFM. Afterward, a mask is covered on the thin film, and a solvent annealing and illuminating step is conducted by using the experimental apparatus shown in FIG. 4. In the 1st example, the first solvent is toluene, i.e., the solvent annealing and illuminating step is conducted under the atmosphere of toluene. The mask used in the 1st example includes a plurality of exposing areas parallel to each other, a width of each of the exposing areas is 50 µm, and a shortest distance between any two of the exposing areas adjacent to each other is 50 µm. A light source of an OM (purchase from Nikon Japan) is adopted as the light source of the solvent annealing and illuminating step. At different time points of the solvent annealing and illuminating step, the surface morphology of the thin film is observed and recorded by an OM and an AFM in a tapping mode, so that a plurality of OM photographs and AFM images showing the surface morphology of the thin film are obtained. Then the AFM images are converted into cross-sectional views showing the profile of the thin film via the built-in software of the AFM.

Figure 6A:
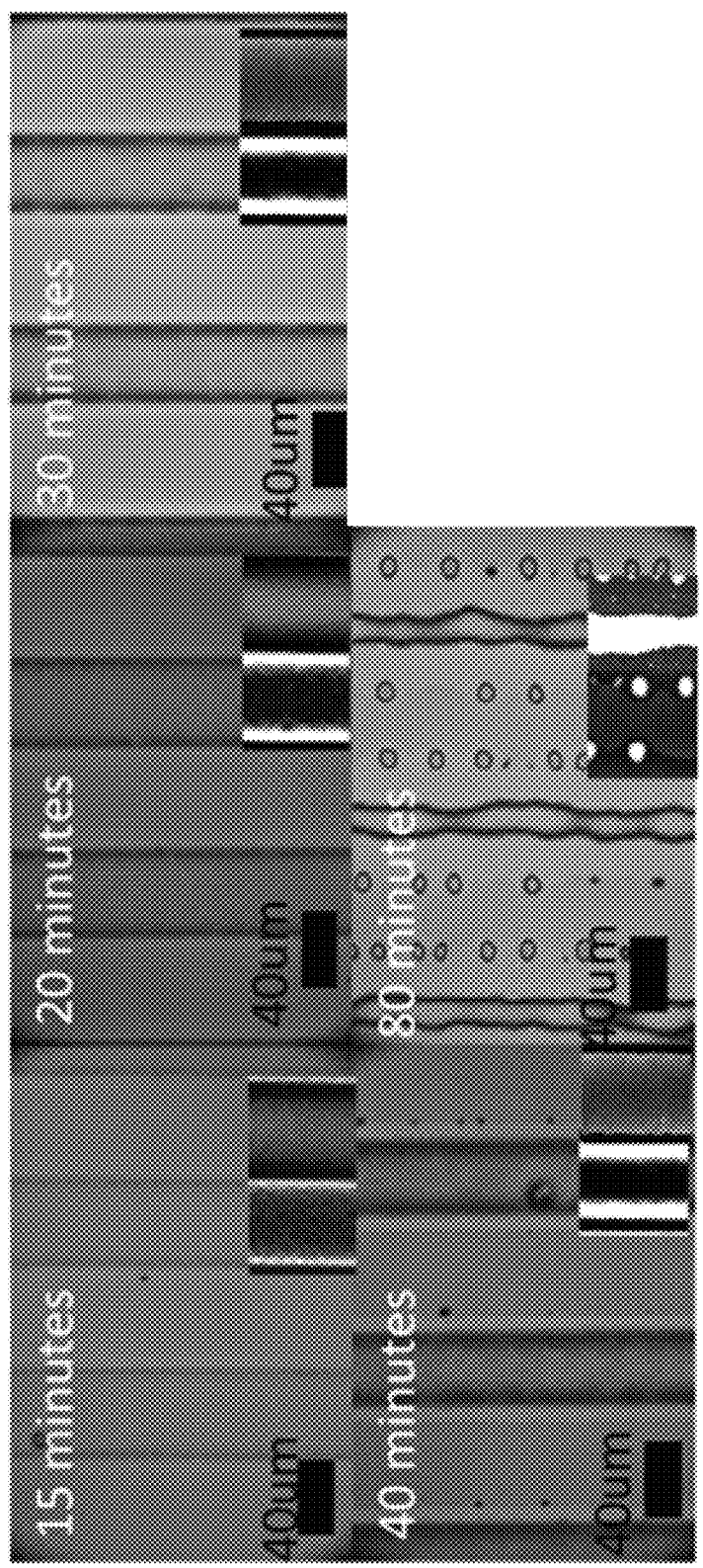
FIG. 6A shows optical microscopy (OM) photographs and atomic force microscopy (AFM) images of a thin film according to the 1st example of the present disclosure.
Figure 6B:
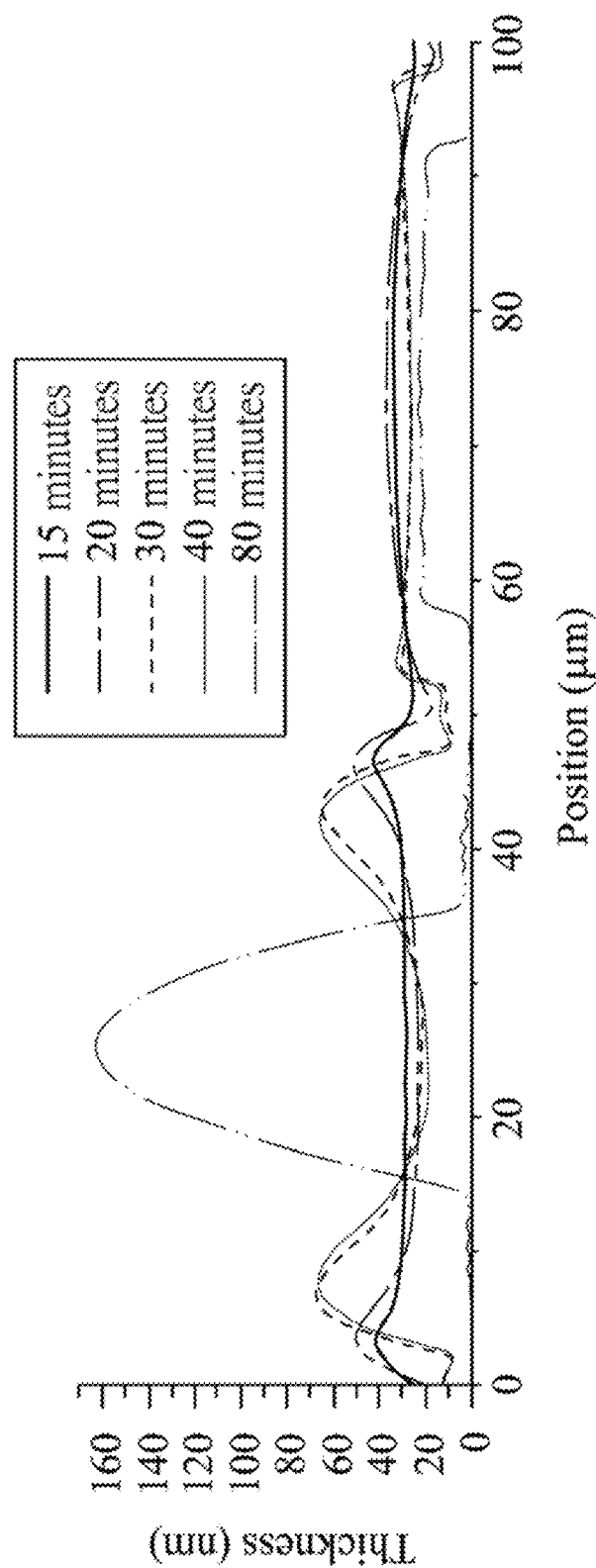
FIG. 6B shows cross-sectional views of the thin film correspondent to the AFM images in FIG. 6A.

FIG. 6A shows the OM photographs and the AFM images of the thin film according to the 1st example of the present disclosure. FIG. 6B shows the cross sectional views of the thin film correspondent to the AFM images in FIG. 6A. Specifically, FIG. 6A shows OM photographs of the thin film at time points of 15 minutes, 20 minutes, 30 minutes, 40 minutes and 80 minutes of the solvent annealing and illuminating step. At the bottom right corner of each of the OM photographs are two AFM images correspondent to the OM photographs. As shown in FIGS. 6A and 6B, after the solvent annealing and illuminating step, a thickness of each of the illuminated regions (correspondent to the exposing areas of the mask) of the thin film is increased, a thickness of each of the dark regions (correspondent to areas of the mask other than the exposing areas) of the thin film is decreased relatively, so that a linear pattern is formed on the thin film. From FIGS. 6A and 6B it is deduced that MEH-PPV molecules in the illuminated regions reach the excited state after being illuminated with the light source, and the MEH-PPV molecules are more planar and rigid than the MEH-PPV molecules without being illuminated with the light source. Base on the theories of entropy and free energy, a molecular flow mainly composed of PS molecules for balancing the distribution of the free energy of the thin film is generated. The molecular flow moves from the dark regions to the illuminated regions, so that the thickness of each of the illuminated regions is increased, and the thickness of each of the dark regions is decreased relatively. The change of the thickness of the thin film is more obvious at the boundaries between the illuminated regions and the dark regions. Furthermore, as shown in FIGS. 6A and 6B, the thin film can be divided into raised areas and valley areas, wherein the raised areas are correspondent to the thin film where the thickness is increased, i.e., the raised areas are the illuminated regions in the 1st example, and the valley areas are correspondent to the thin film where the thickness is decreased, i.e., the valley areas are the dark regions in the 1st example. In practical applications, other materials may be required to be deposited on the valley areas, such as a metal material as a conductor. However, the thin film remained in the valley areas may result in adverse effects. For facilitating the subsequent application, the thin film remained in the valley areas may be removed via reactive-ion etching (RIE) without masking. The method for removing the thin film remained in the valley areas may be applied to other examples of the disclosure, and will not be repeated hereinafter.

2nd Example

The weight ratio of MEH-PPV (200 k) and PS (2 k) in the 1st example is changed into 5:95, and the rest experimental conditions in the 2nd example are the same as that in the 1st example, so that a thin film of the 2nd example is obtained. A thickness of the thin film of the 2nd example is 31 nm which is measured by AFM. Afterward, a mask is covered on the thin film, and a solvent annealing and illuminating step is conducted, which are the same as that in the 1st example, and is not repeated herein.

Figure 7A:
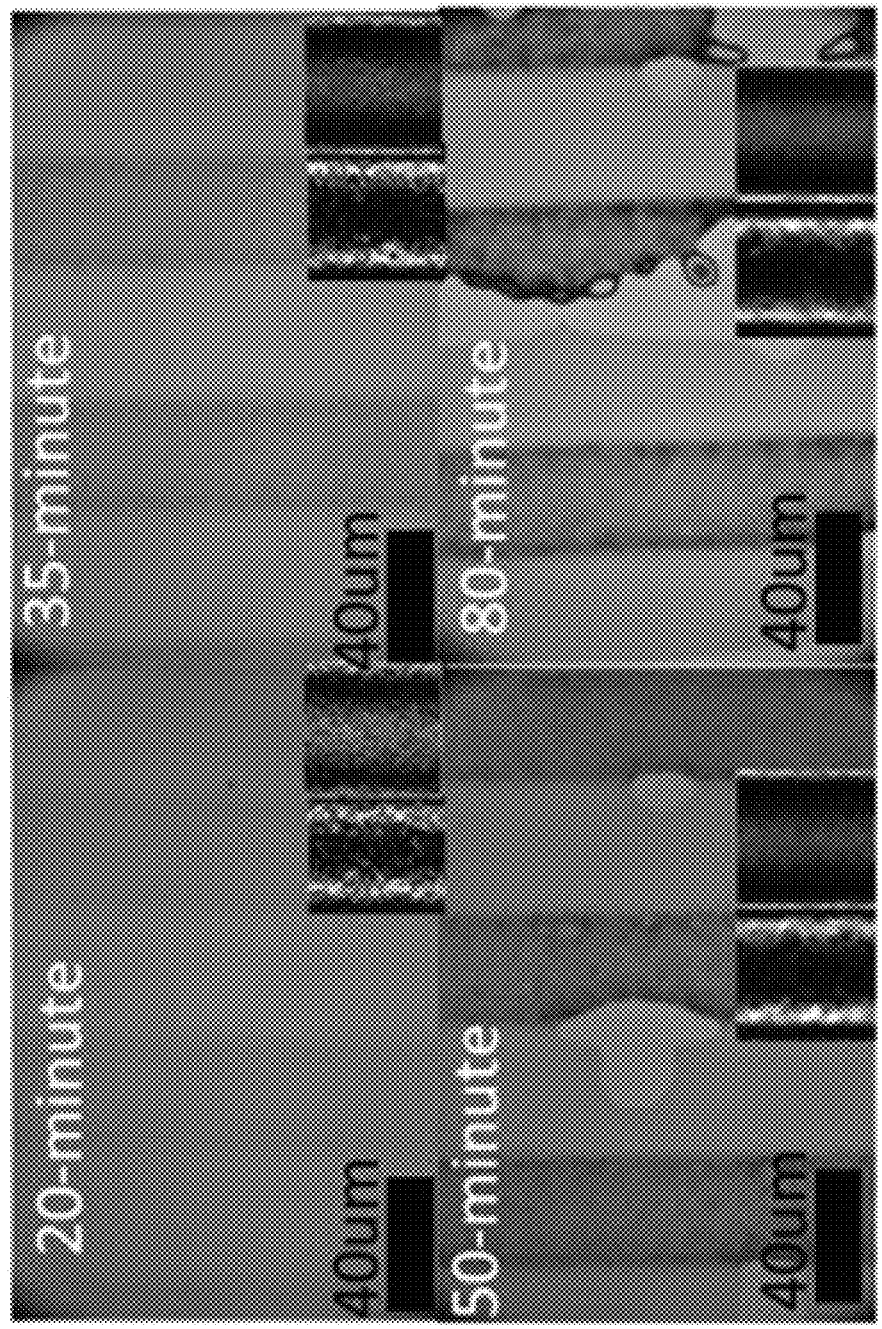
FIG. 7A shows OM photographs and AFM images of a thin film according to the 2nd example of the present disclosure.
Figure 7B:
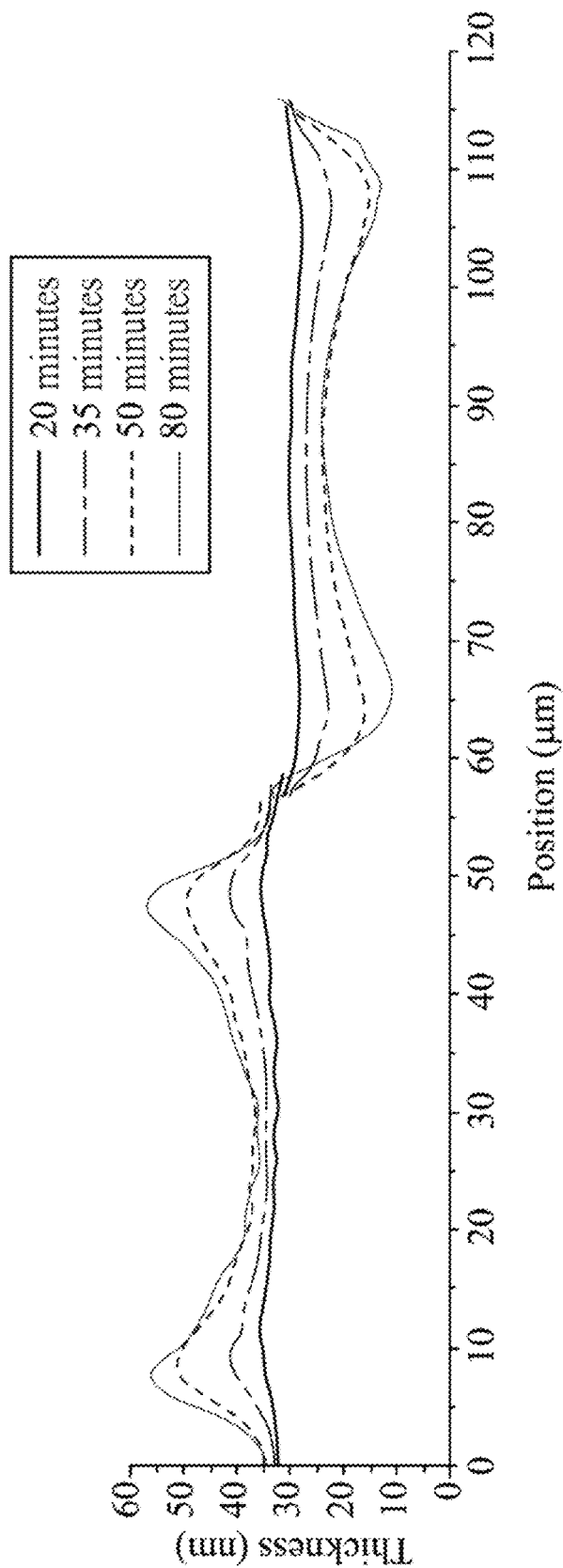
FIG. 7B shows cross-sectional views of the thin film correspondent to the AFM images in FIG. 7A.

FIG. 7A shows OM photographs and AFM images of the thin film according to the 2nd example of the present disclosure. FIG. 7B shows cross-sectional views of the thin film correspondent to the AFM images in FIG. 7A. Specifically, FIG. 7A shows OM photographs of the thin film at time points of 20 minutes, 35 minutes, 50 minutes and 80 minutes of the solvent annealing and illuminating step. At the bottom right corner of each of the OM photographs are two AFM images correspondent to the OM photographs. As shown in FIGS. 7A and 7B, after the solvent annealing and illuminating step, a thickness of each of the illuminated regions (correspondent to the exposing areas of the mask) of the thin film is increased a thickness of each of the dark regions (correspondent to areas of the mask other than the exposing areas) of the thin film is decreased relatively, so that a linear pattern is formed on the thin film. From FIGS. 7A and 7B it is deduced that MEH-PPV molecules in the illuminated regions reach the excited state after being illuminated with the light source, and the MEH-PPV molecules are more planar and rigid than the MEH-PPV molecules without being illuminated with the light source. Base on the theories of entropy and free energy, a molecular flow mainly composed of PS molecules for balancing the distribution of the free energy of the thin film is generated. The molecular flow moves from the dark regions to the illuminated regions, so that the thickness of each of the illuminated regions is increased, and the thickness of each of the dark regions is decreased relatively. The change of the thickness of the thin film is more obvious at the boundaries between the illuminated regions and the dark regions.

3rd Example

MEH-PPV (200 k) is put into a glass container (the content of MEH-PPV in a thin film of the 3rd example is 100 wt %), and a second solvent is added therein. The second solvent is a mixture of toluene, tetrahydrofuran and cyclohexanone in a volume ratio of 1:1:1. A magnetic stir bar is put into the glass container, and then the glass container is heated with a magnetic stirrer at 50° C. for about 2 days. The solution in the glass container is filtered with a 0.2 µm filter so as to obtain a first solution. The first solution is spin coated on a silicon wafer with a spin coater at a rotational speed of 8000 rpm for 20 seconds. The thin film of the 3rd example is formed on the silicon wafer. The silicon wafer with the thin film disposed in a vacuum device is evacuated for one day, so that the second solvent remained in the thin film can be volatilized. A thickness of the thin film of the 3rd example is 18 nm which is measured by AFM. Afterward, a mask is covered on the thin film, and a solvent annealing and illuminating step is conducted. In the 3rd example, the first solvent is toluene, i.e., the solvent annealing and illuminating step is conducted under the atmosphere of toluene. The mask used in the 3rd example includes a plurality of exposing areas parallel to each other, and the exposing areas have two different widths. At the left side of the mask, the width of the exposing areas is 5 µm, and a shortest distance between any two of the exposing areas adjacent to each other is 5 µm. At the right side of the mask, the width of the exposing areas is 50 µm, and a shortest distance between any two of the exposing areas adjacent to each other is 50 µm. A light source of an OM (purchase from Nikon Japan) is adopted as the light source of the solvent annealing and illuminating step. After 8 hours of the solvent annealing and illuminating step, the surface morphology of the thin film is observed and recorded by an AFM in a tapping mode, so that an AFM image showing the surface morphology of the thin film is obtained. Then the AFM image is converted into a cross-sectional view showing the profile of the thin film via the built-in software of the AFM.

Figure 8:
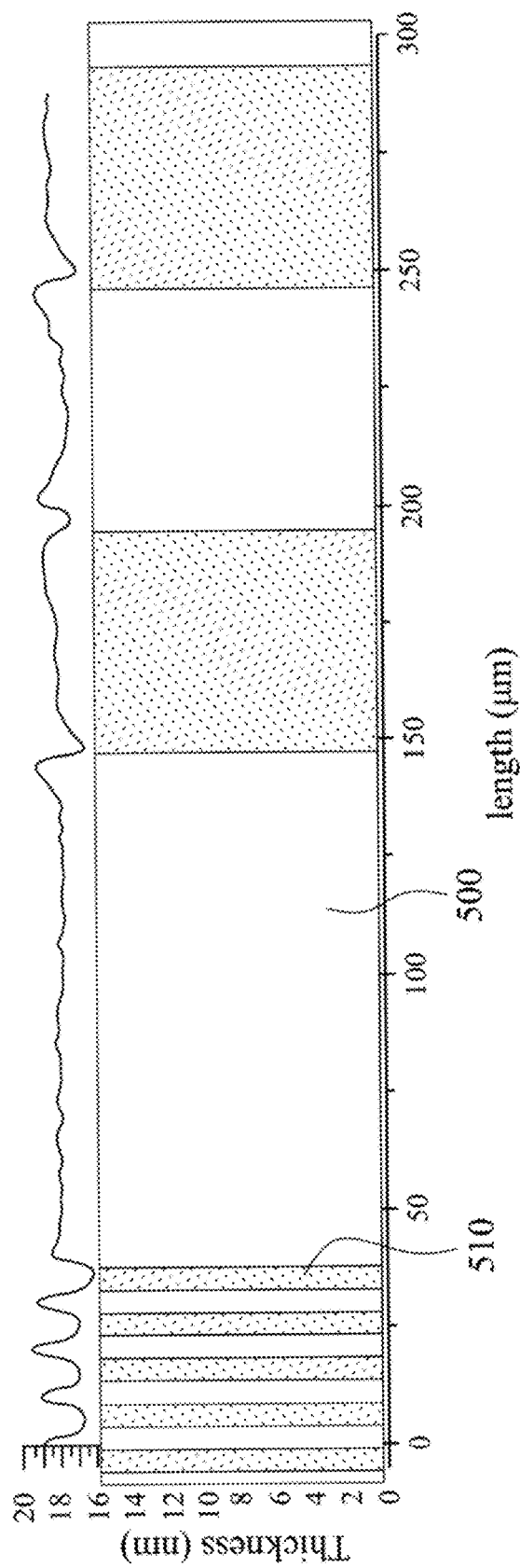
FIG. 8 shows a relationship between a cross-sectional view of a thin film according to the 3rd example of the present disclosure and a mask.

FIG. 8 shows a relationship between the cross-sectional view of the thin film according to the 3rd example of the present disclosure and the mask 500. As shown in FIG. 8, a thickness of each of the illuminated regions (correspondent to the exposing areas 510 of the mask 500) of the thin film is decreased and a thickness of each of the dark regions (correspondent to areas of the mask other than the exposing areas) of the thin film is increased relatively, which is contrary to the results of the 1st example and the 2nd example. A linear pattern is formed on the thin film. From FIG. 8 it is deduced that MEH-PPV molecules in the illuminated regions reach the excited state after being illuminated with the light source and the MEH-PPV molecules are more planar and rigid than the MEH-PPV molecules without being illuminated with the light source. Comparing to 1st example, the molecular flow mainly composed of PS molecules from the dark regions to the illuminated regions no longer exists in the 3rd example. In the 3rd example, the molecular flow mainly composed of PS molecules in the 1st example is replaced by another molecular flow mainly composed of MEH-PPV molecules from the illuminated regions to the dark regions, so that the thickness of each of the dark regions is increased, which is for reducing the energy of the MEH-PPV molecules and the energy of the thin film. Meanwhile, due to the excited state of the MEH-PPV molecules, the MEH-PPV molecules are more rigid and a movement velocity thereof is smaller than that of the MEH-PPV molecules without being illuminated by the light source. Therefore, the flow rate of the molecular flow mainly composed of MEH-PPV molecules in the 3rd example is much smaller than the flow rate of the molecular flow mainly composed of PS molecules in other examples. Furthermore, when the content of MEH-PPV is much greater than the content of PS in the thin film, the situation is similar to the 3rd example. Preferably, the weight ratio of MEH-PPV and PS is greater than 75:25. In this case, the molecular flow mainly composed of PS molecules from the dark regions to the illuminated regions no longer exists or becomes unimportant, and another molecular flow mainly composed of MEH-PPV molecules from the illuminated regions to the dark regions dominates, so that the thickness of each of the dark regions is increased.

4th Example

The MEH-PPV (200 k) in the 1st example is replaced by MEH-PPV (55 k), the weight ratio of MEH-PPV (55 k) and PS (2 k) in the 4th example is 5:95, and the rest experimental conditions in the 4th example are the same as that in the 1st example so as to obtain a thin film of the 4th example. A thickness of the thin film of the 4th example is 30 nm which is measured by AFM. A mask is covered on the thin film. The mask used in the 4th example includes a plurality of exposing areas parallel to each other, a width of each of the exposing areas is 5 µm, and a shortest distance between any two of the exposing areas adjacent to each other is 5 µm. Afterward, a solvent annealing and illuminating step is conducted, which is the same as that in the 1st example, and is not repeated herein.

Figure 9A:
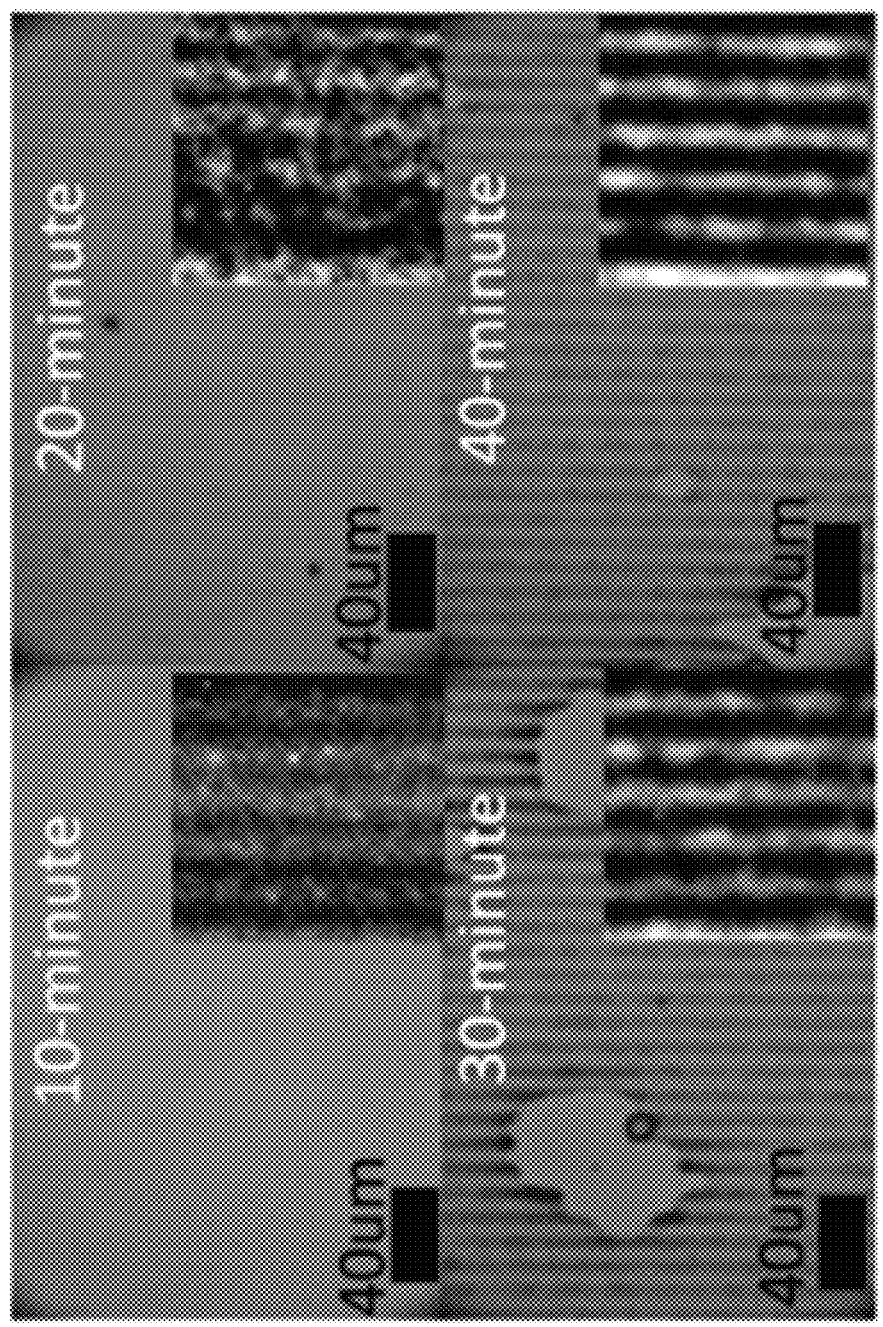
FIG. 9A shows OM photographs and AFM images of a thin film according to the 4th example of the present disclosure.
Figure 9B:
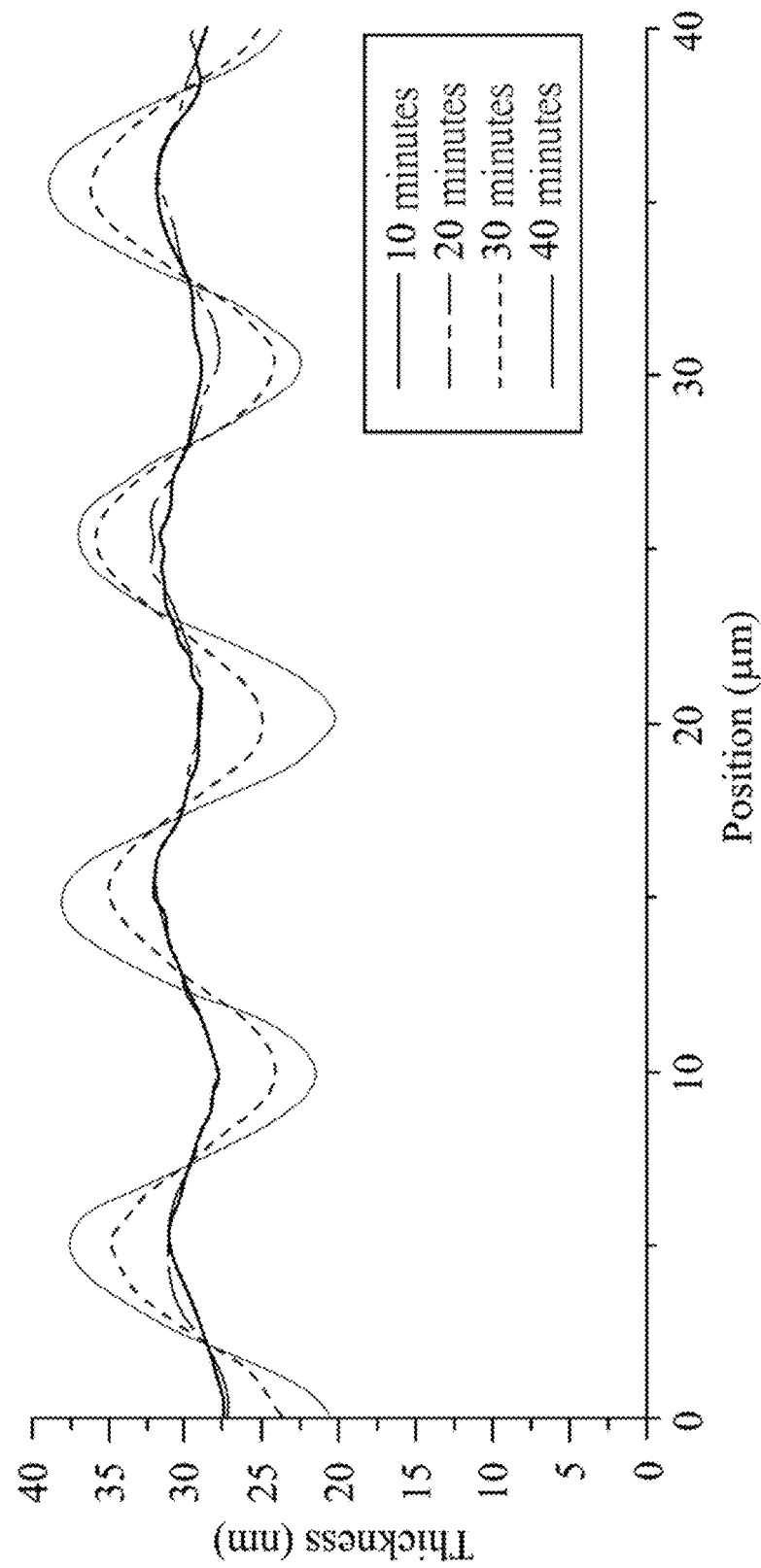
FIG. 9B shows cross-sectional views of the thin film correspondent to the AFM images in FIG. 9A.

FIG. 9A shows OM photographs and AFM images of the thin film according to the 4th example of the present disclosure. FIG. 9B shows cross-sectional views of the thin film correspondent to the AFM images in FIG. 9A. Specifically, FIG. 9A shows OM photographs of the thin film at time points of 10 minutes, 20 minutes, 30 minutes and 40 minutes of the solvent annealing and illuminating step. At the bottom right corner of each of the OM photographs is an AFM image correspondent to the OM photograph. As shown in FIGS. 9A and 9B, after the solvent annealing and illuminating step, a thickness of each of the illuminated regions (correspondent to the exposing areas of the mask) of the thin film is increased, a thickness of each of the dark regions (correspondent to areas of the mask other than the exposing areas) of the thin film is decreased relatively, so that a linear pattern is formed on the thin film. Furthermore, as the time of the solvent annealing and illuminating step increases, the increasing amount of the thickness of each of the illuminated regions is increased, too.

5th Example

The MEH-PPV (200 k) in the 1st example is replaced by MEH-PPV (55 k), the weight ratio of MEH-PPV (55 k) and PS (2 k) in the 5th example is 15:85, and the rest experimental conditions in the 5th example are the same as that in the 1st example so as to obtain a thin film of the 5th example. A thickness of the thin film of the 5th example is 30 nm which is measured by AFM. A mask is covered on the thin film. The mask used in the 5th example includes a plurality of exposing areas parallel to each other, a width of each of the exposing areas is 5 µm, and a shortest distance between any two of the exposing areas adjacent to each other is 5 µm. Afterward, a solvent annealing and illuminating step is conducted, which is the same as that in the 1st example, and is not repeated herein.

Figure 10A:
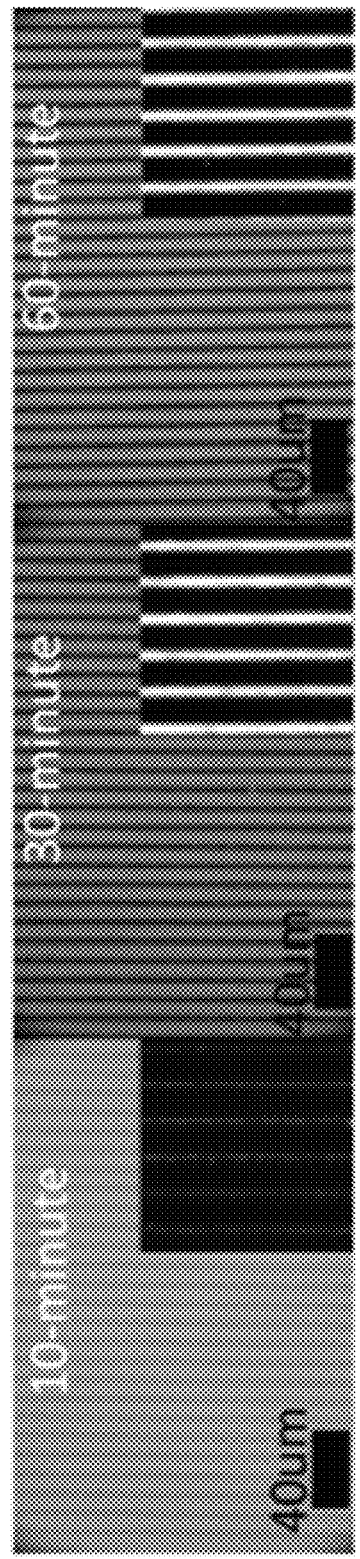
FIG. 10A shows OM photographs and AFM images of a thin film according to the 5th example of the present disclosure.
Figure 10B:
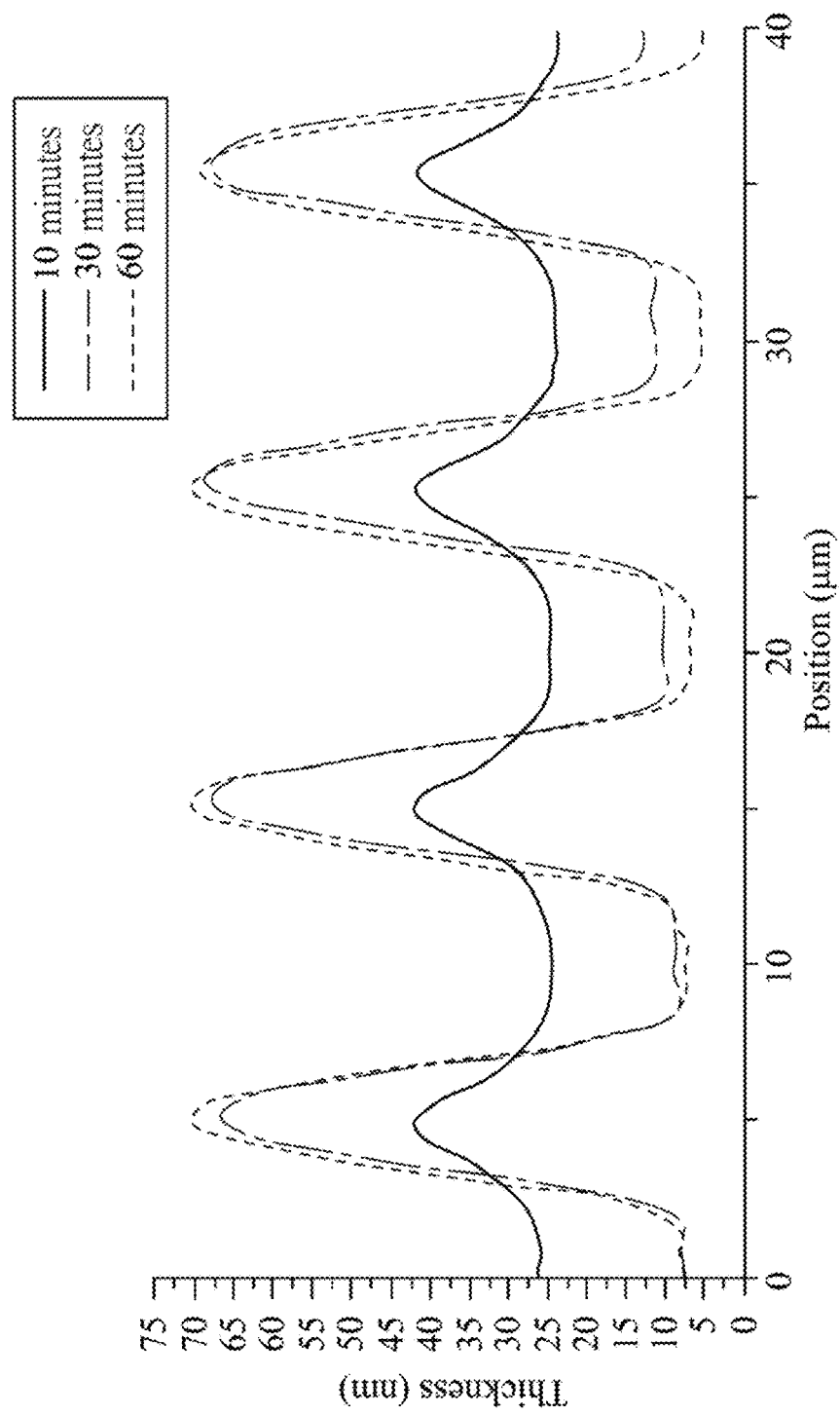
FIG. 10B shows cross-sectional views of the thin film correspondent to the AFM images in FIG. 10A.

FIG. 10A shows OM photographs and AFM images of the thin film according to the 5th example of the present disclosure. FIG. 10B shows cross-sectional views of the thin film correspondent to the AFM images in FIG. 10A. Specifically, FIG. 10A shows OM photographs of the thin film at time points of 10 minutes, 30 minutes and 60 minutes of the solvent annealing and illuminating step. At the bottom right corner of each of the OM photographs is an AFM image correspondent to the OM photograph. As shown in FIGS. 10A and 10B, after the solvent annealing and illuminating step, a thickness of each of the illuminated regions (correspondent to the exposing areas of the mask) of the thin film is increased, a thickness of each of the dark regions (correspondent to areas of the mask other than the exposing areas) of the thin film is decreased relatively, so that a linear pattern is formed on the thin film. Furthermore, as the time of the solvent annealing and illuminating step increases, the increasing amount of the thickness of each of the illuminated regions is increased, too.

As shown in the 1st example to the 5th example, when the concentration of the first molecules is lower than the concentration of the second molecules, the thickness of each of the illuminated regions can be increased within a short time (no more than 80 minutes) so as to form the pattern on the thin film. Comparing to the conventional photoresist etching method, the time of patterning is significantly shortened. Accordingly, the production efficiency is increased and the energy consumption is reduced. Moreover, when the shortest distance between any two exposing areas adjacent to each other of the mask is reduced from 50 μm to 5 μm, the increasing amount of the thickness of each of the illuminated regions increases. That is, the thickness difference between the illuminated regions and the dark regions (the height difference of the pattern) can be adjusted by changing the shortest distance between any two exposing areas adjacent to each other of the mask, which is simple for operation. When the concentration of the first molecules is higher than the concentration of the second molecules or when the thin film only has the first molecules, the thickness of each of the illuminated regions decreases slowly. For example, in the 3rd example, the thickness difference between the illuminated regions and the dark regions is about 2 nm after 8 hours of experiment. Therefore, the pattern formed thereby can be precise to the level of single-digit nanometer. The precision of patterning can thus be enhanced significantly.

6th Example

A thin film is formed according to the method of the 5th example. A thickness of the thin film of the 6th example is 27 nm. A mask is covered on the thin film. The mask used in the 6th example includes a plurality of exposing areas parallel to each other, a width of each of the exposing areas is 5 μm, and a shortest distance between any two of the exposing areas adjacent to each other is 5 μm. Afterward, a solvent annealing and illuminating step is conducted, which is the same as that in the 1st example, and is not repeated herein.

1st Comparative Example

A thin film is formed according to the method of the 6th example. A solvent annealing step is conducted when the thin film is not covered by a mask and a light source is not provided (i.e. the solvent annealing step is conducted without masking and illuminating). Accordingly, there is no pattern formed on the thin film of the 1st comparative example.

2nd Comparative Example

A thin film is formed according to the method of the 6th example. A solvent annealing and illuminating step is conducted when the thin film is not covered by a mask (i.e. the solvent annealing and illuminating step is conducted without masking). Accordingly, there is no pattern formed on the thin film of the 2nd comparative example.

The PL spectra of the thin films of the 6th example, the 1st comparative example and the 2nd comparative example are measured by a confocal spectrometer (Type: Acton SP2300; purchased from Princeton Instrument).

Figure 11A:
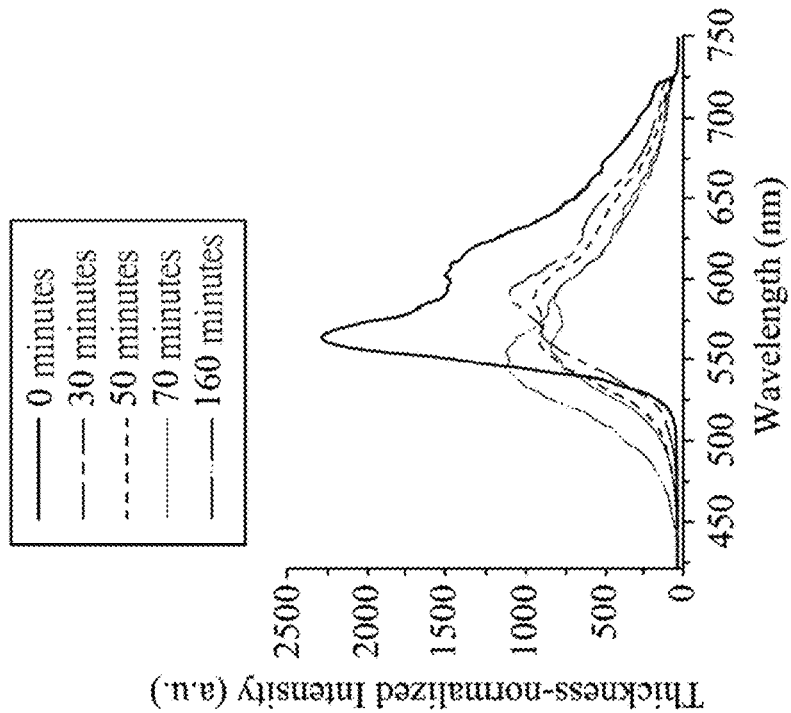
FIG. 11A shows photoluminescence (PL) spectra of a thin film according to the 1st comparative example.
Figure 11B:
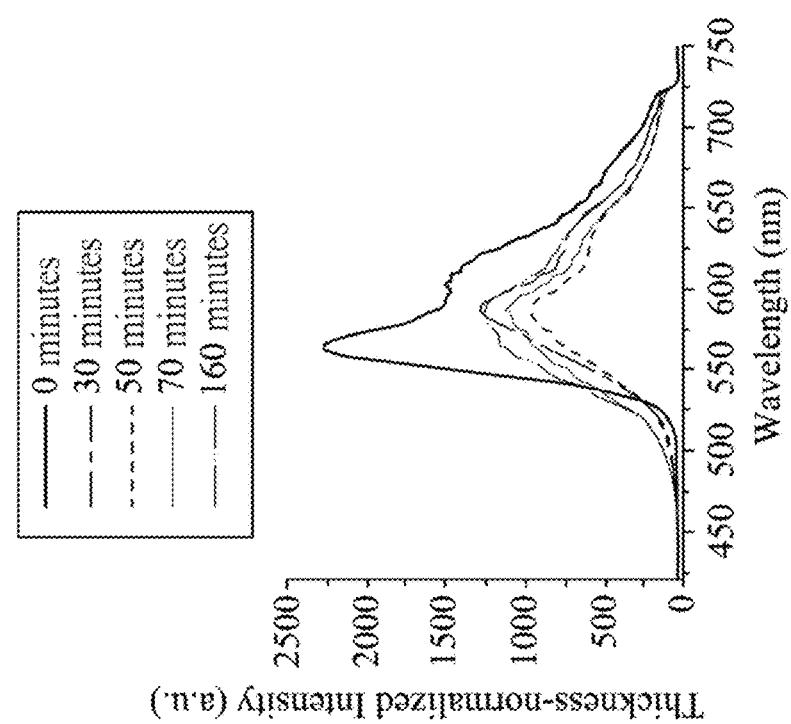
FIG. 11B shows PL spectra of a thin film according to the 2nd comparative example.

FIG. 11A shows the PL spectra of the thin film according to the 1st comparative example. FIG. 11B shows the PL spectra of the thin film according to the 2nd comparative example. In FIGS. 11A and 11B, the vertical axis represents the thickness-normalized intensity, which is proportional to the photoluminescence efficiency (PL efficiency). In FIG. 11A, "0 minutes" is the spectrum of the thin film of the 1st comparative example omitted the solvent annealing step. "30 minutes" is the spectrum of the thin film of the 1st comparative example dealt with the solvent annealing step for 30 minutes, "50 minutes" is the spectrum of the thin film of the 1st comparative example dealt with the solvent annealing step for 50 minutes, and so on. In FIG. 11B, "0 minutes" is the spectrum of the thin film of the 2nd comparative example omitted the solvent annealing and illuminating step. "30 minutes" is the spectrum of the thin film of the 2nd comparative example dealt with the solvent annealing and illuminating step for 30 minutes, "50 minutes" is the spectrum of the thin film of the 2nd comparative example dealt with the solvent annealing and illuminating step for 50 minutes, and so on. As shown in FIGS. 11A and 11B, when the thin film is illuminated with the light source (i.e., the 2nd comparative example), as the time of illumination increases, a blue shift continues. Furthermore, in both of the 1st comparative example and 2nd comparative example, the maximum luminescence intensity (after thickness normalization) of the spectra of "30 minutes", "50 minutes", "70 minutes" and "160 minutes" are all smaller than that of the spectrum of "0 minutes".

Figure 12B:
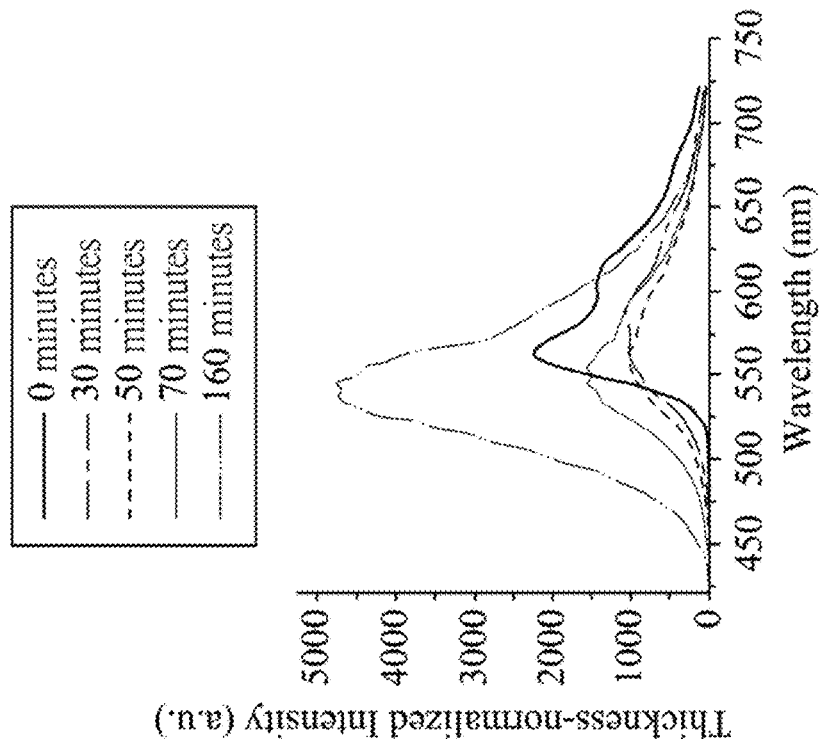
FIG. 12B shows PL spectra of an illuminated region of a thin film according to the 6th example of the present disclosure.
Figure 12A:
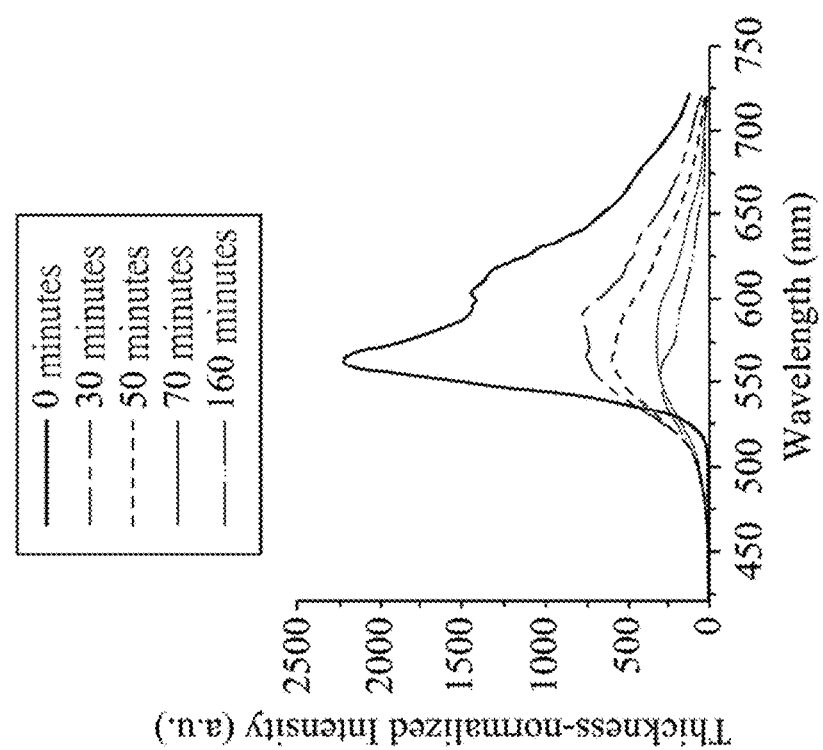
FIG. 12A shows PL spectra of a dark region of a thin film according to the 6th example of the present disclosure.

FIG. 12A shows PL spectra of a dark region of the thin film according to the 6th example of the present disclosure. FIG. 12B shows PL spectra of an illuminated region of the thin film according to the 6th example of the present disclosure. In FIGS. 12A and 12B, the vertical axis represents the thickness-normalized intensity, which is proportional to the PL efficiency. In FIGS. 12A and 12B, "0 minutes" is the spectrum of the thin film of the 6th example omitted the solvent annealing and illuminating step, i.e., there is no pattern formed on the thin film. "30 minutes" is the spectrum of the thin film of the 6th example dealt with the solvent annealing and illuminating step for 30 minutes, "50 minutes" is the spectrum of the thin film of the 6th example dealt with the solvent annealing and illuminating step for 50 minutes, and so on. As shown in FIGS. 12A and 12B, when the time of the solvent annealing and illuminating step is equal to or greater than 50 minutes, a blue shift occurs at the dark region and the illuminated region of the thin film. Furthermore, as the time of the solvent annealing and illuminating step increases, the thickness-normalized luminescence intensity of the illuminated region of the thin films increases, which can be observed from the spectrum of "160 minutes" in FIG. 12B. From FIGS. 12A and 12B it is deduced that when the thin film is covered by the mask and illuminated by the light source, a driving force enabling the first molecules and/or the second molecules to flow along a certain direction is provided, and the stress is increased simultaneously, so that the probability of the electron-phonon coupling reduced. Comparing to the 2nd comparative example, when the thin film is illuminated by the light source without masking, the driving force enabling the first molecules and/or the second molecules to flow along a certain direction cannot be provided, so that the pull between the first molecules and/or the second molecules and the stress cannot be caused. Accordingly, the photoluminescence efficiency (thickness-normalized luminescence intensity) cannot be enhanced. As shown in FIGS. 12B and 11B, when the thin film is covered by the mask and illuminated by the light source, and the shortest distance between any two of the exposing areas adjacent to each other is 5 µm, the thickness-normalized luminescence intensity can be increased significantly.

To sum up, the thin film according to the present disclosure includes the first molecules having a conjugated structure, by illuminating the thin film covered by the mask, the movement direction of the molecules (the first molecules, or the first molecules and the second molecules) can be controlled, so that a pattern can be formed on the thin film; by controlling the concentration difference between the first molecules and the second molecules, the increase or decrease of the thickness of the illuminated region can be controlled. When the concentration of the first molecules is much higher than that of the second molecules, the precision of the pattern can be enhanced (as shown in the 3rd example); when the concentration of the first molecules is lower than that of the second molecules (as shown in the 1st example, the 2nd example, the 4th example and the 5th example), the time of illumination can be shortened. Accordingly, the production efficiency can be increased and the energy consumption can be reduced. Moreover, comparing to the conventional photoresist etching method, the method according to the present disclosure does not require an etching solution and has fewer steps, so that the process can be simplified, the production efficiency can be enhanced, and the method can meet the environmental protection demand. Comparing to the RIE method and the NIL method, the method according to the present disclosure does not require expensive equipments, the demand to the operating environment is lower, and the technical difficulty is also lower, too. Accordingly, the cost can be reduced, and the production efficiency can be enhanced. Furthermore, the thin film can be formed by the spin coating method, which is favorable for applying to the substrates with a large area. Accordingly, it is favorable to broaden the application of the method according to the present disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of patterning a thin film, comprising:
    forming the thin film, wherein the thin film comprises a plurality of first molecules, and each of the first molecules has a conjugated structure,
    covering a mask on the thin film, wherein the mask comprises at least one exposing area, and the exposing area is correspondent to an illuminated region of the thin film; and
    conducting a solvent annealing and illuminating step, wherein the thin film covered by the mask is illuminated with a light source under an atmosphere of a first solvent, and a wavelength range of the light source is correspondent to an energy enabling the first molecules to reach an excited state;
    thus, a thickness of the illuminated region of the thin film is increased or decreased so as to form a pattern on the thin film.

2. The method of patterning the thin film of claim 1, wherein the first molecules are poly(p-phenylene vinylene), polyaniline, polypyrrole, polythiophene, polyacetylene or a derivative thereof.

3. The method of patterning the thin film of claim 1, wherein the first molecules are poly[2-methoxy-5-((2'-ethylhexyl)oxy)-1,4-phenylenevinylene].

4. The method of patterning the thin film of claim 1, wherein the step of forming the thin film comprises:
    providing the first molecules and a second solvent;
    mixing the first molecules and the second solvent so as to form a first solution; and
    spin coating the first solution on a substrate so as to form the thin film on the substrate.

5. The method of patterning the thin film of claim 4, wherein the second solvent is toluene, tetrahydrofuran, cyclohexanone or a mixture thereof.

6. The method of patterning the thin film of claim 4, wherein the first molecules are poly[2-methoxy-5-((2'-ethylhexyl)oxy)-1,4-phenylenevinylene], the second solvent is a mixture of toluene, tetrahydrofuran and cyclohexanone in a volume ratio of 1:1:1, and the substrate is a silicon wafer.

7. The method of patterning the thin film of claim 1, wherein a thickness of the thin film is 2 nm to 100 nm.

8. The method of patterning the thin film of claim 1, wherein the first solvent is toluene, p-xylene, methanol, tetrahydrofuran, cyclohexanone, benzene, dichlorobenzene, dichloromethane, acetone or a mixture thereof.

9. The method of patterning the thin film of claim 1, wherein the mask comprises a plurality of exposing areas, a shortest distance between any two of the exposing areas adjacent to each other is greater than 0, and is smaller than or equal to 5 µm.

10. The method of patterning the thin film of claim 1, wherein the thin film further comprises a plurality of second molecules, and a weight ratio of the first molecules and the second molecules is 1:99 to 99:1.

11. The method of patterning the thin film of claim 10, wherein each of the second molecules has a conjugated structure, and the energy enabling the first molecules to reach the excited state is different from an energy enabling the second molecules to reach an excited state.

12. The method of patterning the thin film of claim 11, wherein the second molecules are poly(p-phenylene vinylene), polyaniline, polypyrrole, polythiophene, polyacetylene or a derivative thereof.

13. The method of patterning the thin film of claim 10, wherein the first molecules are poly[2-methoxy-5-((2'-ethylhexyl)oxy)-1,4-phenylenevinylene], the second molecules are polystyrene, and the first solvent is toluene.

14. The method of patterning the thin film of claim 10, wherein the step of forming the thin film comprises:
    providing the first molecules, the second molecules and a second solvent;
    mixing the first molecules, the second molecules and the second solvent so as to form a second solution; and
    spin coating the second solution on a substrate so as to form the thin film on the substrate.

15. The method of patterning the thin film of claim 14, wherein the first molecules are poly[2-methoxy-5-((2'-ethylhexyl)oxy)-1,4-phenylenevinylene], the second molecules are polystyrene, the second solvent is a mixture of toluene, tetrahydrofuran and cyclohexanon in a volume ratio of 1:1:1, and the substrate is a silicon wafer.

16. The method of patterning the thin film of claim 1, wherein the thin film further comprises a plurality of second molecules, and a weight ratio of the first molecules and the second molecules is 5:95 to 15:85.

* * * * *